United States Patent [19]

Kennedy et al.

[11] Patent Number: 5,548,830
[45] Date of Patent: Aug. 20, 1996

[54] DUAL-BAND FREQUENCY-SELECTIVE ATTENUATOR FOR AUTOMATIC GAIN CONTROL

[75] Inventors: John F. Kennedy; Timothy S. Klepaczyk, both of Dearborn, Mich.

[73] Assignee: Ford Motor Company, Dearborn, Mich.

[21] Appl. No.: 173,026

[22] Filed: Dec. 27, 1993

[51] Int. Cl.$^6$ .................................................... H04B 1/16
[52] U.S. Cl. ........................................ 455/200.1; 455/249.1
[58] Field of Search ........................ 333/172, 171; 329/143; 343/792; 455/232.1, 243.1, 200.1, 191.1, 191.2, 191.3, 193.2, 193.3, 195.1, 245.1, 248.1, 249.1, 250.1, 266

[56] References Cited

U.S. PATENT DOCUMENTS

| | | | |
|---|---|---|---|
| 3,218,641 | 11/1965 | Maynard | 455/266 |
| 3,716,808 | 2/1973 | Malinowski | 333/72 |
| 4,339,828 | 7/1982 | Chasek | 455/266 |
| 4,381,566 | 4/1983 | Kane | 455/193.3 |
| 4,426,622 | 1/1984 | Rittenbach | 329/143 |
| 4,619,000 | 10/1986 | Ma | 455/191.1 |
| 4,730,195 | 3/1988 | Phillips et al. | 343/792 |
| 4,837,852 | 6/1989 | Takada et al. | 455/193.3 |
| 4,972,353 | 11/1990 | Kennedy et al. | 455/234 |
| 5,040,239 | 8/1991 | Kondo et al. | 455/193 |
| 5,101,509 | 3/1992 | Lai | 455/340 |
| 5,140,700 | 8/1992 | Kennedy | 455/142 |
| 5,239,701 | 8/1993 | Ishii | 455/200.1 |
| 5,263,187 | 11/1993 | Sugawa et al. | 455/245.1 |

*Primary Examiner*—Andrew Faile
*Attorney, Agent, or Firm*—Mark Mollon

[57] ABSTRACT

Automatic gain control in a radio receiver is provided using a pair of saturable reactors in resonant circuits for providing variable attenuation. One resonant circuit has a frequency above the desired RF signal while the other has a resonant frequency below the desired RF signal. The resonant frequencies are symmetrically shifted about the desired frequency in response to the AGC signal.

15 Claims, 3 Drawing Sheets

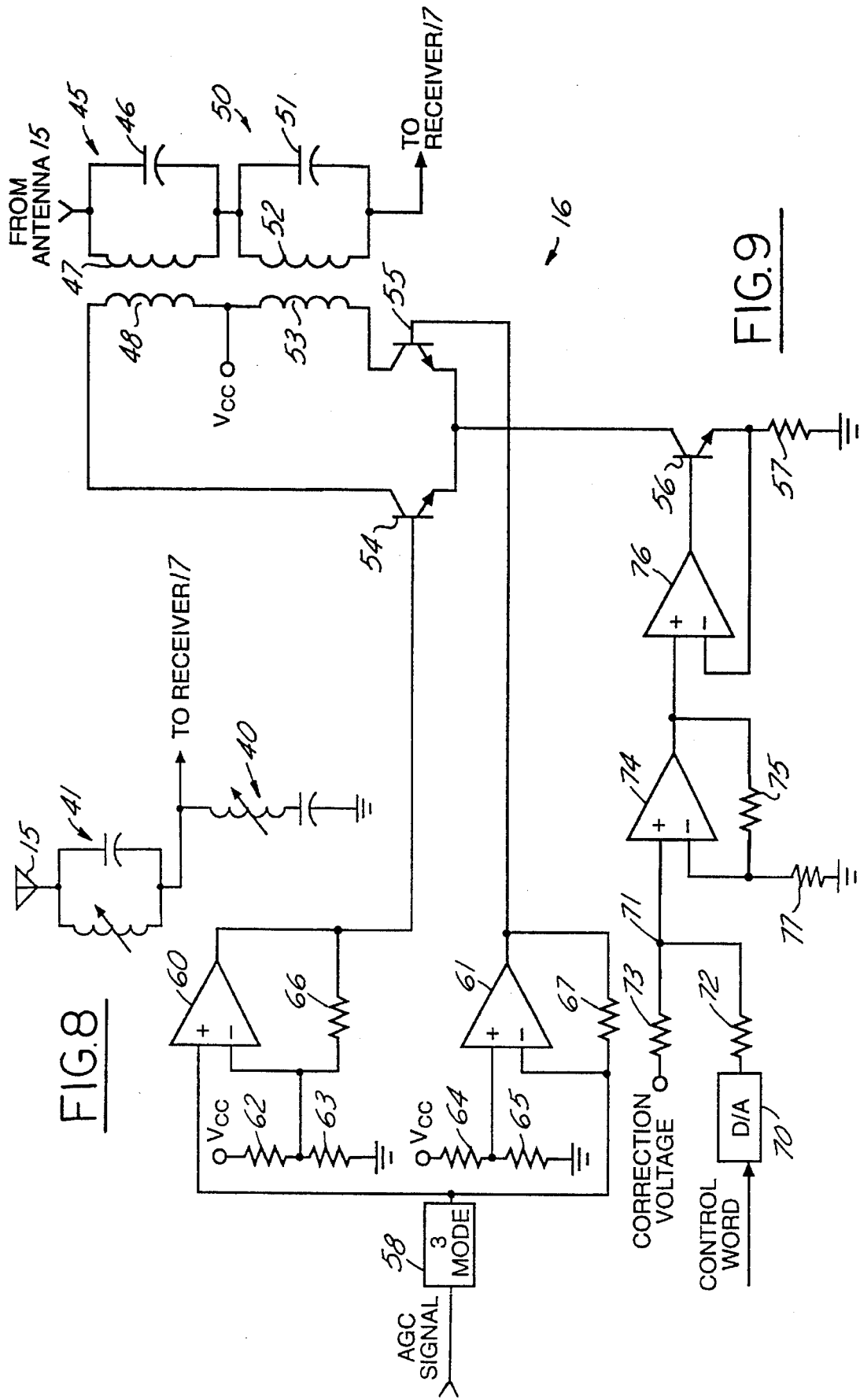

5,548,830

DUAL-BAND FREQUENCY-SELECTIVE ATTENUATOR FOR AUTOMATIC GAIN CONTROL

BACKGROUND OF THE INVENTION

The present invention relates in general to automatic gain control in radio receivers, and more specifically to variable attenuators using saturable reactors.

Radio receivers employ automatic gain control (AGC) to insure that an amplifier output remains at nearly a constant level in spite of variations in the strength of incoming signals. In a digital signal processing (DSP) receiver that converts an analog radio signal to a digital signal for processing, automatic gain control of the analog signal limits the RF level to the input of an analog-to-digital converter (A/D) to ensure that the dynamic range of the A/D is correctly utilized and to protect the A/D from being damaged by excess voltage levels.

SUMMARY OF THE INVENTION

The present invention has the advantages of providing AGC action over a large dynamic range using linear components, thereby avoiding intermodulation distortion.

These advantages are achieved in a circuit for automatic gain control of an electrical signal in response to an AGC signal wherein the electrical signal has a selected center frequency and is applied to a signal processor. The circuit comprises a first attenuator coupled to the signal processor having a first adjustable resonant frequency which is below the center frequency. A second attenuator is coupled to the signal processor and has a second adjustable resonant frequency that is above the center frequency. A first control circuit is coupled to the first and second attenuators adjusting the resonant frequencies to be symmetrical about the center frequency. A second control circuit is coupled to the first and second attenuators adjusting the spacing between the first and second resonant frequencies in the response to the AGC signal.

BRIEF DESCRIPTION OF THE DRAWINGS

FIG. 8 is a schematic diagram showing a second embodiment of the attenuator block of the present invention.

FIG. 9 is a schematic diagram showing the attenuator and control circuit in greater detail.

DETAILED DESCRIPTION OF PREFERRED EMBODIMENTS

Figure 1:
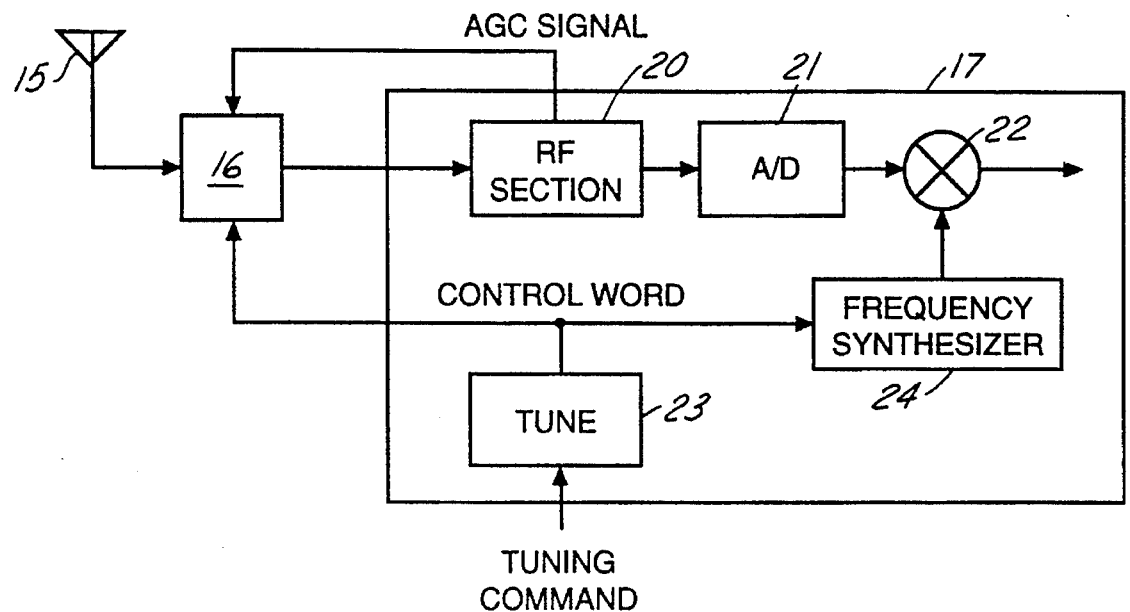
FIG. 1 is a block diagram showing a receiver according to the present invention.

Referring to FIG. 1, an antenna 15 provides an antenna signal to attenuation block 16. An attenuated signal is provided to an RF section 20 in a receiver 17. An AGC signal generated in RF section 20 is provided to attenuation block 16. The AGC signal is generated in a conventional manner. The AGC signal is a DC voltage having a magnitude proportional to the strength of the received RF signal. The AGC signal controls the magnitude of the attenuation provided by attenuation block 16 (i.e., attenuation increases to maintain a fixed RF signal strength to the receiver as the antenna RF signal level increases).

The amplified RF signal from RF section 20 is provided to an A/D converter 21. A digitized RF signal is provided to one input of a digital mixer 22. The digital RF signal is mixed with a mixing signal from a frequency synthesizer 24 to translate a desired broadcast signal to an intermediate frequency in a process known as heterodyning. A tune circuit 23 generates a control word provided to frequency synthesizer 24 in response to a tuning command from a human operator depending on the mixing signal needed to mix the desired RF signal to the intermediate frequency. The control word is also coupled to attenuation block 16 to control the resonant frequency positioning of resonant circuits within attenuation block 16 as described below.

Figure 2:
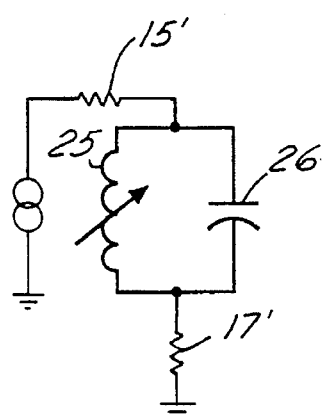
FIG. 2 is a schematic diagram showing a parallel resonant circuit employed in the present invention.
Figure 3:
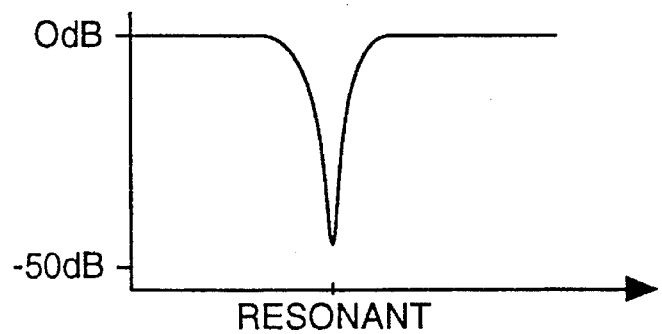
FIG. 3 plots attenuation of the circuit of FIG. 2 when connected to an antenna and a receiver.
Figure 4:
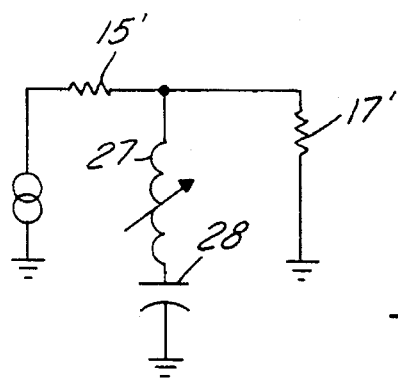
FIG. 4 is a schematic diagram of a series resonant circuit employed in the invention.

Attenuation block 16 is comprised of resonant LC circuits of the type described in FIGS. 2–4. A parallel LC circuit is shown in FIG. 2 including a variable inductor 25 and a fixed capacitor 26. The characteristic impedance (Z) of the parallel LC circuit when connected in series between the effective impedance 15' of the antenna and the effective impedance 17' of the receiver provides the frequency-selective attenuation shown in FIG. 3. Very little or no attenuation of the antenna signal results at frequencies away from the resonant frequency of the LC circuit and a maximum attenuation of up to about 50 dB or more results at the resonant frequency. Intermediate values of attenuation along the sloping potion of the attenuation curve are exploited for variable AGC action.

The series resonant circuit of FIG. 4 includes a variable inductor 27 and fixed capacitor 28 connected in series between ground and the junction of antenna impedance 15' and receiver input impedance 17'. The characteristic impedance (Z) of the series LC circuit working against the antenna and receiver impedances also provides the frequency-selective attenuation shown in FIG. 3.

Figure 5:
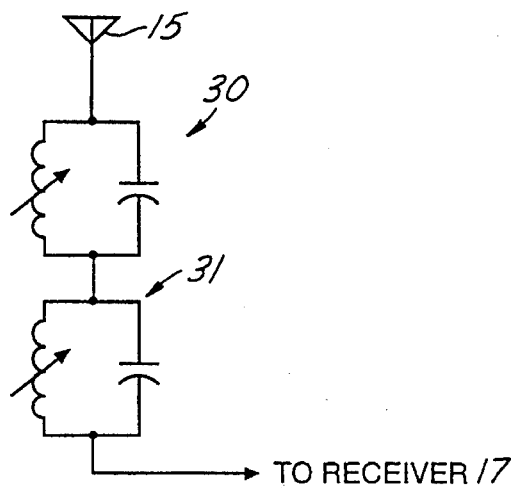
FIG. 5 is a schematic diagram of a first embodiment of the attenuator block of the present invention.
Figure 6:
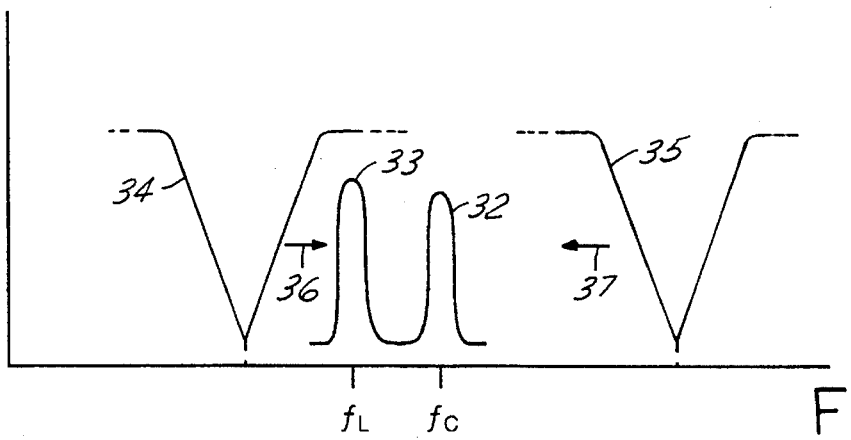
FIG. 6 plots attenuation provided by the circuit of FIG. 6 with no AGC action.

The attenuation block of the present invention employs two co-acting variably frequency-selective attenuators to provide a controlled attenuation of an RF signal as determined by the magnitude of the AGC signal. As shown in FIG. 5, antenna 15 provides an antenna signal to a pair of parallel LC resonant circuits 30 and 31 connected in series. The output of LC circuit 31 is provided to receiver 17. As shown in FIG. 6, the antenna signal includes a desired broadcast signal 32 having a center frequency $f_c$. Other broadcast signals within the antenna signal are present, such as a lower adjacent channel signal 33 at a center frequency $f_L$. Parallel LC circuit 30 (FIG. 5) provides frequency selective attenuation as shown by curve 34 in FIG. 6, and parallel LC circuit 31 provides attenuation as shown by curve 35. The resonant frequencies (at which maximum attenuation occurs) are symmetrically located with respect to center frequency $f_c$. If the AGC signal is low, indicating a low field strength and no need for attenuation, then curves 34 and 35 are spaced away from center frequency $f_c$ such that no attenuation occurs for desired signal 32.

As received strength of the RF signal increases and attenuation becomes necessary, curves 34 and 35 are moved toward center frequency $f_c$ as indicated by arrows 36 and 37, such that attenuation occurs for desired signal 32. Curves 34 and 35 remain symmetrical with respect to center frequency $f_c$ but the spacing between the respective resonant frequencies is decreased in order to increase AGC action. As the spacing between $f_c$ and each respective resonant frequency decreases, the attenuation of $f_c$ increases. Due to the slopes of attenuation curves 34 and 35, a spacing exists such that the required amount of AGC action can be attained. An important benefit of the invention is that nondesired signals, such as adjacent channel signal 33, are attenuated prior to and to a greater degree than the desired signal. Thus, adjacent channel and intermodulation distortion are decreased.

FIG. 8 shows an alternative embodiment wherein antenna 15 is connected to LC circuits 40 and 41. LC circuit 41 is a parallel resonant circuit connected in series between antenna 15 and receiver 17 as discussed in the embodiment of FIG. 5. LC circuit 40 is a series resonant circuit coupled to ground in parallel across the input to receiver 17. LC circuit 40 shunts signals away from the receiver input. Since parallel LC circuit 41 is connected between antenna 15 and series LC circuit 40, antenna efficiency is maintained and a high dynamic range of attenuation (up to about 70 dB) is obtained.

Figure 7:
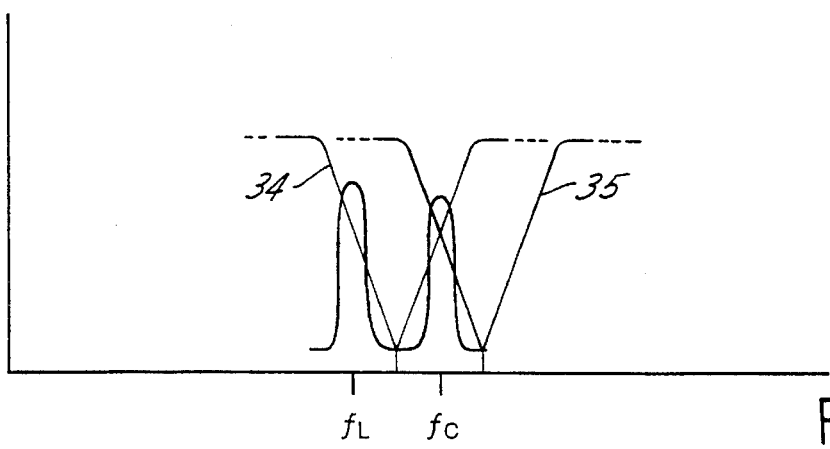
FIG. 7 plots attenuation provided by the circuit of FIG. 6 with active AGC attenuation to reduce the signal level of a desired signal.

The resonant frequencies of LC circuit 40 and 41 are controlled in the same manner as described with reference to FIGS. 6 and 7, although circuit 40 acts as a variable frequency shunt across the input to receiver 17 rather than as a controllable loss in series with the input to receiver 17.

FIG. 9 shows a preferred implementation of attenuation block 16 according to the present invention. Antenna signals from antenna 15 are coupled to a parallel LC circuit 45 comprising a capacitor 46 connected in parallel with an inductor 47. A control winding 48 is magnetically coupled with inductor 47 to provide a variable inductance and, therefore, a variable resonant frequency for LC circuit 45. For example, control winding 48 generates a magnetic field proportional to the current flowing in control winding 48 that magnetizes a core of inductor 47 to reduce the permeability of the core and thus reduce the inductance.

A parallel LC circuit 50 is connected in series with LC circuit 45 and is comprised of a capacitor 51 connected in parallel with an inductor 52 magnetically coupled to a control winding 53. The output of LC circuit 50 is coupled to receiver 17.

A supply voltage $V_{cc}$ is coupled to a terminal between the junction of control windings 48 and 53. A pair of transistors 54 and 55 have their collector terminals connected to control windings 48 and 53, respectively. The emitter terminals of transistors 54 and 55 are connected together and to the collector terminal of a transistor 56. The emitter terminal of transistor 56 is coupled to ground through a current sensing resistor 57.

The AGC signal is input to a three-mode (proportional-integral-derivative) controller 58. The output of controller 58 is coupled to the noninverting input of a differential amplifier 60 and to the inverting input of a differential amplifier 61. A voltage divider comprised of resistors 62 and 63 provides a first reference voltage to the inverting input of differential amplifier 60. A voltage divider comprised of resistors 64 and 65 provides a second reference voltage to the noninverting input of differential amplifier 61. Feedback resistors 66 and 67 are connected between the outputs and inverting inputs of differential amplifiers 60 and 61, respectively. The output of differential amplifier 60 is connected to the base terminal of transistor 54 and the output of differential amplifier 61 is connected to the base terminal of transistor 55.

The control word is coupled to a digital-to-analog converter (D/A) 70 to generate an analog voltage proportional to the desired RF frequency to be received by the receiver. The analog voltage is coupled to a summing junction 71 through a resistor 72. A correction voltage that compensates for the hysteresis curve response of control windings 48 and 53 is provided to summing junction 71 through a resistor 73. The summed voltage is provided to the noninverting input of an operational amplifier 74 providing a fixed gain stage. A feedback resistor 75 is coupled between the output and inverting input of operational amplifier 74, and a resistor 77 couples the inverting input to ground.

The output of operational amplifier 74 is connected to the noninverting input of a differential amplifier 76 which has its output connected to the base terminal of transistor 56. The noninverting input of differential amplifier 76 is connected to current sensing resistor 57.

In operation, a voltage is generated at summing junction 71 which is proportional to the frequency of the RF signal to be received plus a correction to compensate for the nonlinear (hysteresis) frequency relation of control windings 48 and 53. This voltage is multiplied by a predetermined gain factor to obtain a voltage related to the current flow desired through the control windings 48 and 53 as discussed below. Differential amplifier 76 compares that voltage with the voltage drop across current sensing resistor 57 which represents the actual current flowing through the control windings. Transistor 56 is driven as a current source which generates the correct total current flow through the control windings.

The inductances of inductors 47 and 52 are selected such that the resonant frequencies of LC circuits 45 and 50 (with no current flow in the control windings) are spaced apart by a predetermined frequency (about 20 MHz for a standard FM broadcast receiver). The current flow controlled by transistor 56 modifies the inductances by an amount that shifts the resonant frequencies anywhere in the broadcast band of interest to be symmetrically placed around the desired RF frequency as specified by the control word.

In order to provide AGC action, the spacing between the resonant frequencies must be shifted once they have been symmetrically placed about the desired frequency. Thus, transistors 54 and 55 are provided to distribute the total current between control windings 48 and 53. Differential amplifiers 60 and 61 and the associated components are designed such that when the AGC signal corresponds to no attenuation (e.g., the AGC signal is zero volts), the base voltages for transistor 54 and 55 are equal and the current is equally distributed between control winding 48 and 53. As the value of the AGC signal increases (i.e., indicating increasing attenuation is needed), the output voltage from differential amplifier 60 decreases and the output voltage from differential amplifier 61 increases. Thus, transistor 54 conducts less current, and transistor 55 conducts more current resulting in more saturation of inductor 52 and less saturation of inductor 47. Therefore, the resonant frequencies are varied in an opposite sense and by equal amounts. As a result, the resonant frequencies continue to be symmetrically placed around the desired frequency but have a variable spacing therebetween.

Due to the delay time in reaching a desired current flow in control windings 48 and 53, three-mode controller 58 is needed to provide stability in closing the AGC control loop. Gain margin and phase margin are adjusted as known in the art to optimize the circuit response in a stable operation area.

The correction voltage is determined by the relationship between the control winding current and the resonant frequency of LC circuits 45 and 50. Thus, the correction voltage is an inverse function to produce a linear relationship between the control word and the resonant frequencies. This inverse function can be implemented using a nonlinear circuit such as a diode network connected to the output of D/A converter 70.

Figure 10:
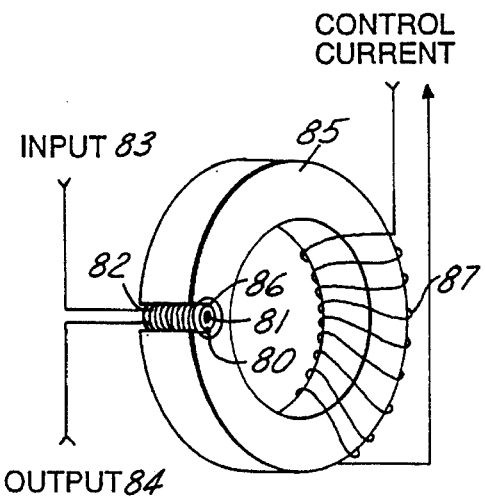
FIG. 10 is a perspective view showing a saturable reactor employed in the present invention.

Turning to FIG. 10, a saturable reactor for providing the variable inductances used in the present invention includes an inductor having a cylindrical winding core 80 surrounding a permeable core 81. An inductor winding 82 is wound on cylindrical core 80 and has an input 83 and an output 84. A control core 85 provides a circular magnetic path passing through a bore 86 which receives the saturable reactor. A control winding 87 is wound on control core 85. The control current flowing through control winding 87 creates magnetic flux through core 85 and through core 81. The magnetizing of core 81 changes the impedance (i.e., self-inductance) of winding 82 since the inductance is proportional to the effective permeability of core 81.

The foregoing invention controls the amount of RF power applied to the front end of a receiver (especially a DSP receiver). A high dynamic range of attenuation of up to 70 dB can be obtained while reducing intermodulation distortion and adjacent channel interference with an attenuation block having a low insertion loss.

What is claimed is:

1. A circuit for automatic gain control of an electrical signal in response to an AGC signal, said electrical signal having a selected center frequency and said electrical signal being applied to a signal processor, said circuit comprising:

a first attenuator coupled to said signal processor having a first adjustable resonant frequency which is below said center frequency;

a second attenuator coupled to said signal processor having a second adjustable resonant frequency which is above said center frequency;

a first control circuit coupled to said first and second attenuators adjusting the frequencies of said first and second resonant frequencies to be symmetrical about said center frequency; and a second control circuit coupled to said first and second attenuators adjusting the spacing between said first and second resonant frequencies in response to said AGC signal to provide controlled attenuation of said electrical signal.

2. The circuit of claim 1 wherein said first and second attenuators are comprised of first and second LC circuits, respectively.

3. The circuit of claim 2 wherein said first and second LC circuits include first and second variable inductors, respectively, each variable inductor having a respective control winding.

4. The circuit of claim 3 wherein said first control is comprised of a current source providing a selected current to said control windings.

5. The circuit of claim 4 wherein said second control is comprised of at least one controlled resistance for distributing said selected current between said control windings to oppositely increase and decrease said first and second resonant frequencies.

6. The circuit of claim 1 wherein said first and second attenuators are comprised of at least one variable, parallel LC circuit connected in series with the input of said signal processor.

7. The circuit of claim 1 wherein said first and second attenuators are comprised of at least one variable, series LC circuit connected in parallel across the input of said signal processor.

8. A broadcast radio receiver comprising:

an antenna;

a receiver section processing a received signal having a selected center frequency and generating an AGC signal in response to the strength of said received signal;

a first attenuator coupled to said receiver section having a first adjustable resonant frequency which is below said center frequency;

a second attenuator coupled to said receiver section having a second adjustable resonant frequency which is above said center frequency;

a first control circuit coupled to said first and second attenuators adjusting the frequencies of said first and second resonant frequencies to be symmetrical about said center frequency; and a second control circuit coupled to said first and second attenuators adjusting the spacing between said first and second resonant frequencies in response to said AGC signal to provide controlled attenuation of said received signal.

9. The receiver of claim 8 wherein said first and second attenuators are comprised of first and second LC circuits, respectively, said first and second LC circuits including first and second variable inductors, respectively, each variable inductor having a respective control winding.

10. The receiver of claim 9 wherein said first control is comprised of a current source providing a selected current to said control windings.

11. The receiver of claim 10 wherein said second control is comprised of at least one controlled resistance for distributing said selected current between said control windings to oppositely increase and decrease said first and second resonant frequencies.

12. A method of automatic gain control in a broadcast receiver, comprising the steps of:

receiving a plurality of broadcast signals from an antenna;

selecting and processing one of said signals from said antenna determined by a desired center frequency;

generating an AGC signal proportional to the strength of said processed signal;

attenuating said signals from said antenna using first and second resonant attenuators, wherein said attenuators are controlled according to the steps of 1) adjusting their resonant frequencies to be symmetrical about said center frequency, and 2) adjusting the spacing between said center frequencies in response to said AGC signal to provide controlled attenuation of said selected broadcast signal.

13. The method of claim 12 wherein said spacing is reduced to increase attenuation of said signals from said antenna and wherein said spacing is increased to decrease attenuation of said signals from said antenna.

14. The circuit of claim 1 wherein said first and second attenuators are connected in series.

15. The receiver of claim 8 wherein said first and second attenuators are connected in series.

\* \* \* \* \*